United States Patent [19]

Lippey

[11] Patent Number: 5,089,439
[45] Date of Patent: Feb. 18, 1992

[54] PROCESS FOR ATTACHING LARGE AREA SILICON-BACKED CHIPS TO GOLD-COATED SURFACES

[75] Inventor: Barret Lippey, Los Angeles, Calif.

[73] Assignee: Hughes Aircraft Company, Los Angeles, Calif.

[21] Appl. No.: 474,578

[22] Filed: Feb. 2, 1990

[51] Int. Cl.$^5$ ............................................. H01L 23/6
[52] U.S. Cl. .................................. 437/209; 428/620; 228/179; 228/181; 148/DIG. 62; 29/843; 437/212
[58] Field of Search ................ 428/620, 672; 437/205, 437/209, 214, 958, 212; 357/68, 16; 106/1.14; 228/181, 179; 148/DIG. 62; 29/843

[56] References Cited

U.S. PATENT DOCUMENTS

| | | | |
|---|---|---|---|
| 3,793,064 | 2/1974 | Budd et al. | 437/209 |
| 4,810,671 | 3/1989 | Bhattacharyya et al. | 437/209 |

FOREIGN PATENT DOCUMENTS

| | | | |
|---|---|---|---|
| 50-7421 | 3/1975 | Japan | 437/209 |
| 54-19364 | 2/1979 | Japan | 437/209 |
| 55-26650 | 2/1980 | Japan | 437/209 |
| 55-110048 | 8/1980 | Japan | 437/209 |
| 56-18434 | 2/1981 | Japan | 437/209 |
| 56-161647 | 12/1981 | Japan | 437/209 |
| 57-26449 | 2/1982 | Japan | 437/209 |
| 61-117845 | 6/1986 | Japan | |
| 63-107148 | 5/1988 | Japan | |

Primary Examiner—Olik Chaudhuri
Assistant Examiner—Andrew Griffis
Attorney, Agent, or Firm—M. E. Lachman; W. J. Streeter; W. K. Denson-Low

[57] ABSTRACT

A method for eutectically attaching a silicon chip to a gold-coated substrate. Prior to heating and scrubbing of the silicon chip against the gold surface, a gold lattice structure is placed between the silicon chip bottom surface and the gold surface. The gold lattice structure contacts the silicon chip bottom surface over an area equal to less than ten percent of the total surface area of the chip bottom surface. The point source contact between the gold lattice and silicon chip promotes formation of the gold/silicon eutectic alloy at temperatures of between 400° to 475° C. The gold/silicon eutectic alloy spreads between the silicon chip bottom surface and gold top surface to provide eutectic bonding. The method is especially useful in bonding relatively large silicon chips or dies to gold-coated substrates wherein the bottom surface or back side of the chip is not coated with a protective metal layer.

17 Claims, 1 Drawing Sheet

PROCESS FOR ATTACHING LARGE AREA SILICON-BACKED CHIPS TO GOLD-COATED SURFACES

FIELD OF THE INVENTION

The present invention relates generally to processes for attaching silicon chips to a supporting substrate. More particularly, the present invention is directed to improving the eutectic bonding of large area silicon chips to gold-coated surfaces wherein the silicon chip does not include metallization on its back side.

DESCRIPTION OF RELATED ART

The use of a gold/silicon eutectic bonding layer is the preferred method of connecting silicon chips or dies to substrates where long-term reliability and high power dissipation are necessary. This attachment procedure is based upon the formation of a gold/silicon eutectic alloy which functions as a bonding layer between the bottom surface of the silicon chip and the top surface of the substrate. Pure gold melts at temperatures of approximately 1100° C. while pure silicon melts at temperatures above 1400° C. Fortunately, the gold/silicon eutectic alloy melts at a temperature of around 400° C., with melting beginning at 367° C. This relatively low melting temperature allows one to attach silicon chips to gold-coated substrates by "scrubbing" the silicon chip against the gold substrate at temperatures of between 400 to 450° C. to form the gold/silicon eutectic.

The above method of attaching silicon chips to gold-coated substrates with a silicon/gold eutectic works well for relatively small chips. However, silicon chips having surface areas of over 0.04 square inch (0.26 square centimeter) usually cannot be reliably attached due to random and inadequate eutectic formation. One solution to this problem was to apply a gold coating onto the back side or bottom of the silicon chip prior to attachment to the gold-coated substrate. Although this approach does improve attachment, it is undesirable due to the added expense and complexity required in coating the silicon chip underside with gold or other protective metal.

Another solution to the problem of attaching relatively large surface area chips to substrates is set forth in U.S. Pat. No. 4,810,671. In this procedure, a "seed" comprised of gold/silicon eutectic alloy is placed between a gold-coated substrate and the silicon chip having an intermediate metal layer on its underside. The size of the eutectic seed layer is approximately ten to twenty percent of the surface area of the gold coating upon which the silicon chip is placed. Although this procedure appears well suited for attaching silicon chips having intermediate metal coatings on their back sides, the procedure is not amenable to attaching silicon-backed chips wherein the back side is not coated with a metal or other material.

Another procedure used to increase the eutectic bonding of silicon chips to gold-coated substrates involves increasing the temperature to levels above 475° C. However, the thermal damage of the electrical properties of the silicon chip which result at such high temperatures are undesirable.

There is a present and continuing need to develop procedures for eutectically attaching silicon chips to gold-coated substrates. Improvements are especially needed with respect to relatively large area chips which do not have their underside protected by a metal layer such as gold or chromium.

SUMMARY OF THE INVENTION

In accordance with the present invention, a method is provided for eutectically attaching a silicon-backed chip to a gold-coated substrate. The invention is based on the discovery that point sources of gold placed between the silicon chip and gold coating provide high pressure points which are capable of forming the gold-/silicon eutectic at the pressure points. The resulting gold/eutectic melt quickly spreads across substantially the entire chip-substrate interface to provide complete eutectic bonding.

As a feature of the present invention, the point sources of gold contact are provided by placing a gold lattice structure between the silicon chip bottom surface and the gold top surface of the substrate. The gold lattice structure has a contact area with the silicon chip which is less than ten percent of the surface area of the silicon chip bottom. The silicon chip bottom surface is then scrubbed against the gold lattice structure with sufficient pressure and at a sufficient temperature to form a gold/ silicon eutectic liquid between the gold lattice structure and the silicon chip. The scrubbing is continued for a sufficient time to form a gold/silicon eutectic attachment between substantially all of the silicon chip bottom surface and the gold top surface of the substrate.

As another feature of the present invention, the gold lattice structure comprises gold wire having a diameter of less than about 0.01 inch (0.025 cm). The gold wire, which is sandwiched between the silicon chip and gold-coated substrate surface, is easily deformed and pressed into the surface pores of the silicon during the application of heat and scrubbing force. Without the gold wire or lattice structure in accordance with the present invention, the silicon chip contacts the entire surface of the gold coating so that the force per unit area of contact is believed to be not high enough to fill the surface pores of the silicon. When the gold lattice structure is used in accordance with the present invention, the force per unit area of contact is much higher so that the wire is easily deformed and pressed into the surface pores of the silicon. Once the gold/silicon eutectic mixture is formed, it melts and then rapidly absorbs more material from its surroundings and spreads over the entire interface between the silicon chip and gold-coated substrate.

The present invention is especially well suited for attaching silicon chips having a silicon backing as opposed to those chips which are provided with a backing of protective metal. A thin layer of silicon oxide always forms on the bottom surface of unprotected silicon-backed chips. This thin layer of oxide is believed to prevent adequate eutectic formation and bonding when relatively large silicon chips are scrubbed against gold-coated substrates. As a feature of the present invention, the gold lattice sandwiched between the silicon chip and gold substrate breaks through the thin layer of oxide to provide formation of the desired gold/silicon eutectic melt. As a result, silicon-backed chips may be easily, conveniently and economically attached to gold-coated substrates. The need for an expensive and time-consuming step of adding a protective metal layer to the silicon chip is not required.

The above-described and many other features and attendant advantages of the present invention will become better understood by reference to the following detailed description when taken in conjunction with the accompanying drawings.

DETAILED DESCRIPTION OF THE PREFERRED EMBODIMENTS

The present invention has wide application to procedures wherein a eutectic mixture is used to bond two articles together. The following detailed description will be limited to bonding arrangements wherein the gold/silicon eutectic is used. However, it will be understood that the principles and teachings of the present invention have wide application to attachment methods in general where eutectic bonding mixtures are formed.

The present invention is applicable to conventional gold/silicon eutectic bonding procedures wherein the bottom silicon surface of a chip or die is bonded to a gold-coated substrate. Such procedures are well known and have been in wide use for some time. The present invention is intended as an improvement upon such procedures. As will be discussed in more detail below, the present invention is especially well suited for attaching relatively large silicon chips to gold-coated surfaces wherein a thin coating of silicon oxide has formed on the bottom surface of the chip. Large silicon chips, as opposed to small silicon chips, typically have a bottom surface area of at least 0.04 square inch (0.26 square cm).

Figure 1:
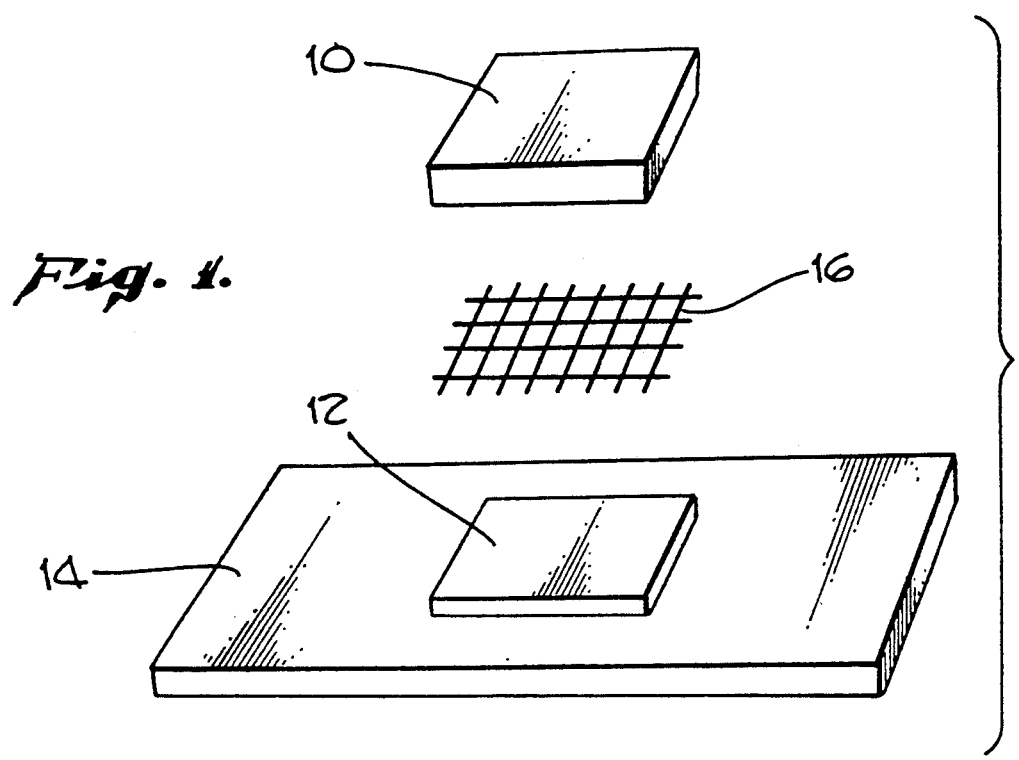
FIG. 1 is an exploded view of a silicon chip, gold wire grid and gold-coated substrate prior to sandwiching together for eutectic attachment.
Figure 2:
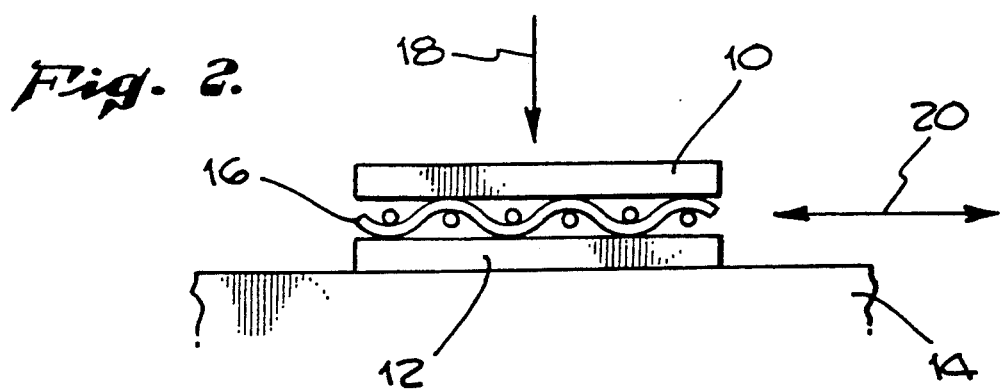
FIG. 2 is a side diagrammatic representation showing the gold lattice structure as it is sandwiched between the silicon chip and the gold-coated substrate.
Figure 3:
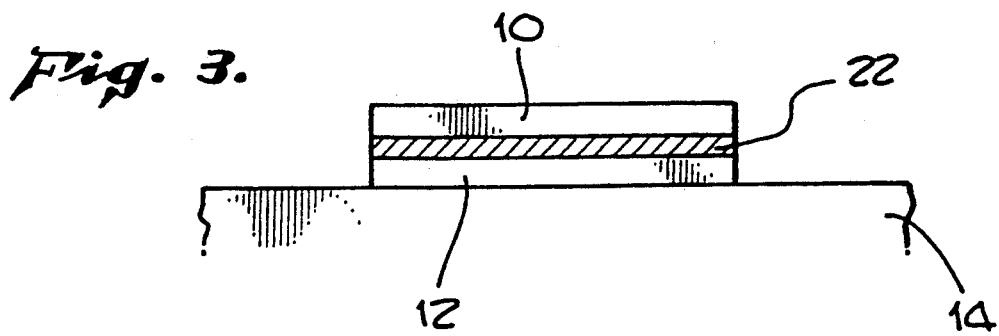
FIG. 3 is a side diagrammatic representation showing the eutectic layer bonding the silicon chip to the gold-coated substrate.

FIGS. 1-3 are pictorial representations of a preferred exemplary method in accordance with the present invention. FIG. 1 depicts a silicon chip 10 which is to be eutectically bonded to a gold coating 12 which is present on an underlying substrate 14. The silicon chip 10, gold coating 12 and substrate 14 are all conventional elements which are well known in the art. Any of the conventional substrate configurations and materials may be used. The thickness of the gold coating 12 is also conventionally known and will range from between about $5 \times 10^{-3}$ inch ($1.3 \times 10^{-2}$ cm) to about $2 \times 10^{-6}$ inch ($5.1 \times 10^{-6}$ cm). In accordance with the present invention, a gold lattice 16 is provided between the silicon chip 10 and gold coating 12. The term "lattice" as used herein includes both random and regular arrangements of the gold wires.

It should be noted that the size of the various elements and thicknesses of the various layers are not shown to scale. Instead, various dimensions are exaggerated for certain elements in order to provide a more clear understanding of the present invention.

In FIG. 2, the gold lattice 16 is shown as it is compressed between the gold coating 12 and silicon chip 10. The arrow 18 represents downward pressure which is exerted on the chip 10 during the bonding process. Double-headed arrow 20 represents the relative sideways movement between chip 10 and gold coating 12 which occurs during the bonding or scrubbing step. The amount of pressure applied to chip 10 and the amount of sideways movement will vary depending upon the chip size and configuration. The application of pressure and relative sideways movement between the chip 10 and gold coating 12 is conventionally referred to as "scrubbing." The pressure required and sideways movement utilized are all conventional parameters which are well known to those skilled in the art.

During the scrubbing step, the overall assembly including chip 10, lattice 16, gold layer 12 and substrate 14 are heated to a temperature of above 400° C., but below 475° C. The heating and scrubbing are continued for a sufficient time until the eutectic bonding layer 22 is formed as shown in FIG. 3. Any of the conventionally known equipment for die or chip bonding may be used to carry out the present invention. One such die or chip bonder is Model 4000 available from Semiconductor Equipment Corporation (Moorpark, Calif.).

The gold lattice 16 is preferably made from pure gold wire having diameters of about 0.01 inch (0.025 cm) or less. Preferably, the diameter of the gold wire will be less than 0.003 inch (0.008 cm). Gold wire having diameters of about 0.001 inch (0.002 cm) are particularly preferred. This wire is available commercially as semiconductor chip interconnect wire. One manufacturer of such wire is the Sigmund Cohn Corp. (Mt. Vernon, N.Y.).

The gold wire is preferably pure gold. Wire made from gold alloys may be used provided that the amount of alloy metal is kept sufficiently small so that the gold wire does not become too hard. The amount of alloy metal incorporated into the pure gold should generally be less than about 0.1 weight percent. Pure gold is preferred because it is soft enough to be deformed and pressed into the surface pores of the silicon while being sufficiently hard to abrade some of the peaks of the thin layer of oxide during scrubbing.

The preferred lattice configuration of the gold wire is an arrangement having a plurality of intersecting gold wires as best shown in FIG. 1. Although this arrangement is preferred, other configurations are possible. For example, the gold wire may be arranged in a series of parallel rows or may be randomly arranged. It is only important that the wire be distributed relatively uniformly and that the total surface area of wire which contacts the bottom surface of silicon chip 10 be less than ten percent. Preferably, the contact area will be less than one percent. Alternatively, the gold wire may be replaced with gold ribbon in any of the previously described lattice configurations.

Gold lattice configurations are also possible which are not made from gold wire. For example, small gold spheres or irregularly shaped gold particles having approximate diameters of less than 0.010 inch (0.025 cm) may be substituted for the gold wire provided that they are uniformly distributed between the silicon chip 10 and gold coating 12. Further, the total surface area contact between the gold spheres or particles and the silicon chip bottom surface must be less than ten percent and preferably less than one percent. When the surface contact is greater than ten percent, the necessary localized pressure between the gold point sources and the silicon chip bottom surface is not sufficient to achieve the desired abrading of the silicon oxide layer and pressing of gold into the silicon pores. It is believed that this abrading of the silicon oxide layer by the gold point sources in combination with pressing of the gold into the silicon pores allows formation of the gold/silicon eutectic which then spreads across the entire silicon chip bottom surface.

Since gold woven wire grid, such as grid 16, is not widely available, one or more strands of gold wire may be randomly arranged between the gold top surface 12 and silicon chip 10. The exact arrangement is not critical provided that the wire is distributed somewhat uniformly between the two surfaces to prevent chip breakage when pressure is applied during the scrubbing process.

The amount of pressure which must be applied during the scrubbing process to form the gold/silicon eutectic may be varied within conventional limits depending upon chip design. The temperature at which the eutectic bonding is carried out is also conventional and is preferably between 367 and 475° C. In all other respects, conventional procedures utilized in die or chip bonding are followed, except that the gold lattice in accordance with the present invention is sandwiched between the gold top layer and silicon chip bottom surface prior to heating and scrubbing.

An example of practice which demonstrates the invention and provides a comparison to a conventional method is as follows. A 0.30 inch (0.76 cm) square silicon-backed chip was die bonded to a ceramic substrate having a gold coating thereon. Bonding was accomplished by scrubbing the chip against the gold-coated surface at a temperature of 475° C. for approximately 10 seconds. The resulting eutectic bond covered approximately fifty percent of the bottom surface of the silicon-backed chip.

The same procedure as above was carried out except that a random arrangement of pure gold wire having a diameter of 0.001 inch (0.002 cm) was placed between the silicon-backed chip bottom surface and gold top surface prior to scrubbing. The resulting eutectic bond covered virtually the complete surface area of the silicon chip bottom surface.

The above examples have been limited to eutectic bonding wherein a silicon-backed chip is bonded to a gold top surface. Although the present invention is particularly suited for bonding such silicon-backed chips where a silicon oxide layer has formed, the invention also has application to those silicon chips which have been previously coated with a protective layer of metal or gold/silicon eutectic alloy. Distributions of the gold wire or ribbon other than the random or grid distributions as set forth in the examples are possible. For example, many conventional die bonding apparatus apply pressure to the silicon chip around the chip edges. Accordingly, it may be desirable in certain instances to locate the gold wire or other gold point sources around the perimeter of the silicon chip to reduce silicon chip breakage during the scrubbing process. Gold lattice orientations may also be utilized which promote propagation and spreading of the gold/eutectic alloy.

Having thus described exemplary embodiments of the present invention, it should be noted by those skilled in the art that the within disclosures are exemplary only and that various other alternatives, adaptations and modifications may be made within the scope of the present invention. Accordingly, the present invention is not limited to the specific embodiments as illustrated herein, but is only limited by the following claims.

What is claimed is:

1. A method for attaching a silicon chip to a substrate wherein said silicon chip has a bottom surface having a surface area and said substrate has a gold top surface, said method comprising the steps of:

(a) placing a gold lattice structure between said silicon chip bottom surface and said gold top surface so that said silicon chip bottom surface and said gold top surface are in contact with said gold lattice structure, said gold lattice structure having a contact area with said silicon chip which is less than ten percent of the surface area of said silicon chip bottom;

(b) scrubbing said silicon chip bottom surface against said gold lattice structure with sufficient pressure and at a sufficient temperature to form a gold/silicon eutectic liquid between said gold lattice structure and said silicon chip bottom surface; and (c) continuing to scrub said silicon chip bottom surface against said gold lattice structure and said gold top surface for a sufficient time to form a gold/silicon eutectic attachment between substantially all of said silicon chip bottom surface and said gold top surface.

2. A method according to claim 1 wherein said surface area of said silicon chip bottom is greater than or equal to about 0.04 square inch (0.26 square cm).

3. A method according to claim 1 wherein said gold lattice structure has a contact area which is less than one percent of the surface area of said silicon chip bottom.

4. A method according to claim 1 wherein said gold lattice structure comprises gold wire having a diameter of less than about 0.010 inch (0.025 cm).

5. A method according to claim 4 wherein the diameter of said gold wire is about 0.001 inch (0.002 cm).

6. A method according to claim 1 wherein the temperature at which said scrubbing occurs is equal to or less than about 475° C.

7. A method according to claim 2 wherein said gold lattice structure has a contact area which is less than one percent of the surface area of said silicon chip bottom.

8. A method according to claim 7 wherein said gold lattice structure comprises gold wire having a diameter of less than about 0.010 inch (0.025 cm).

9. A method according to claim 8 wherein the diameter of said gold wire is about 0.001 inch (0.002 cm).

10. A method according to claim 2 wherein said gold lattice structure comprises gold wire having a diameter of less than about 0.010 inch (0.025 cm).

11. A method according to claim 10 wherein the diameter of said gold wire is about 0.001 inch (0.002 cm).

12. In a method for eutectically attaching a silicon chip to a substrate having a gold top surface, wherein the bottom surface of said silicon chip is scrubbed against said gold top surface at a temperature above the melting point of the gold/silicon eutectic, the improvement comprising:

placing a gold lattice structure between said silicon chip bottom surface and said gold top surface prior to scrubbing said chip against said gold top surface, wherein the contact area of said gold lattice with said silicon chip is less than ten percent of the surface area of said silicon chip bottom surface.

13. The improved method according to claim 12 wherein the surface area of said silicon chip bottom is greater than or equal to about 0.04 square inch (0.26 square cm).

14. The improved method according to claim 12 wherein said gold lattice structure has a contact area which is less than one percent of the surface area of said silicon chip bottom.

15. The improved method according to claim 12 wherein said gold lattice structure comprises gold wire having a diameter of less than about 0.010 inch (0.025 cm).

16. The improved method according to claim 15 wherein the diameter of said gold wire is about 0.001 inch (0.002 cm).

17. The improved method according to claim 12 wherein the temperature at which said scrubbing occurs is equal to or less than 475° C.

* * * * *